Oct. 4, 1960 W. T. GLASSPOOL 2,955,266

IMPEDANCE BALANCED MODULATORS

Original Filed Jan. 25, 1955

INVENTOR.

WILLIAM T. GLASSPOOL

BY Harry R. Lubcke

AGENT

United States Patent Office 2,955,266

Patented Oct. 4, 1960

2,955,266

IMPEDANCE BALANCED MODULATORS

William T. Glasspool, Sherman Oaks, Calif., assignor to Stoddart Aircraft Radio Co., Inc., Los Angeles, Calif., a corporation of California Continuation of abandoned application Ser. No. 483,886, Jan. 25, 1955. This application July 9, 1959, Ser. No. 826,894

6 Claims. (Cl. 332—47)

This invention relates to modulators of the ring type and to means for balancing the same to most fully eliminate the oscillator voltage from the output thereof.

This application is a continuation of my prior application filed January 25, 1955, Serial No. 483,886, and now abandoned.

In numerous applications of these modulators the excellence of performance is very largely determined by the reduction of the carrier oscillator voltage in the output circuit to values very much below the useful modulated signal level. The prior art has been well aware of the difficulty of obtaining rectifier untis of the same impedance and of maintaining a balanced condition in operation. Attempts have been made to surround each rectifier unit with auxiliary resistance and/or reactance elements for this purpose, often of fixed construction.

I have found that the highly desired elimination of oscillator voltage is attained and maintained by relatively simple controls capable of overall and continuously variable adjustment. I prefer to make these controls accessible to the operator so that conditions of temperature, voltage levels or other parameters may be quickly corrected in their effect upon oscillator voltage elimination.

At the present state of the art rectifiers of the dry barrier layer types such as germanium or silicon diodes are perhaps to be preferred for modulators of this type, since greater uniformity is obtainable than in copper oxide or other earlier rectifiers. Thermionic emission diodes and multielectrode tubes require critical control of heater or other current for stable operation.

The prior art has obtained a nominal level of oscillator voltage reduction, such as suitable for carrier telephony. I am able to obtain a reduction of the order of 100 decibels (the residual oscillator voltage only $1/100{,}000$ that of the oscillator input), which is suitable for precise instrument service, for sensitive receivers and for improved telephony results. I am also able to prevent oscillator energy from back-acting upon the signal source by means of a further balance adjustment associated therewith. This is particularly important in receiver applications.

An object of my invention is to attain a degree of oscillator voltage elimination in a balanced modulator heretofore unobtainable.

Another object is to provide a relatively few continuously variable adjustments for maintaining a ring modulator in balance.

Another object is to accomplish balancing with relatively small and simple components.

Another object is to prevent oscillator energy from back-acting upon the input signal source.

Other objects of my invention will become apparent upon reading the following detailed specification and upon examining the related drawings, in which.

Figure 1:
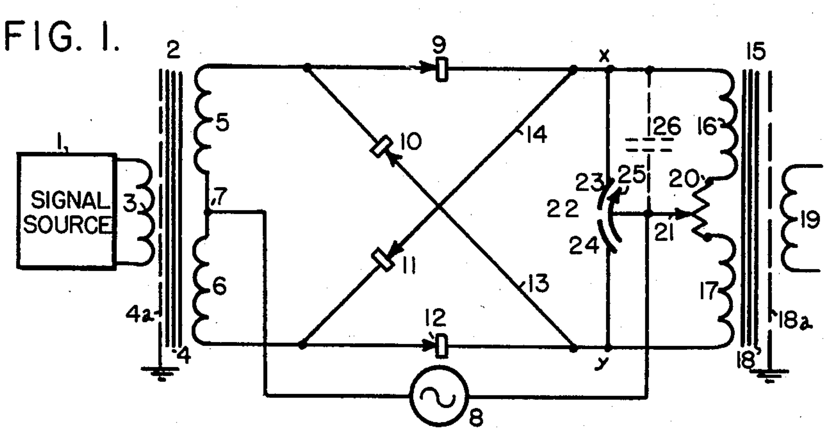
Fig. 1 shows a simplified circuit for my invention.

In Fig. 1, numeral 1 identifies a signal source, which may be an amplifier at signal frequency of energy received from an antenna, a microphone and amplifier for audio frequencies, a television pickup device, an electronic computer device or various equivalents. An input transformer is represented in general by numeral 2, having primary winding 3, magnetic core 4, electrostatic shield **4*a* and two secondary windings 5 and 6. This transformer provides isolation from the signal source so that a center tap may be obtained for feeding oscillator 8 in balanced relation to the main structure. Oppositely poled rectifier units 9 and 10 are connected to the top extremity of secondary winding 5 and equivalents 11 and 12 are similarly connected to the lower extremity of the remaining half of the secondary 6**. Any of the rectifier types previously mentioned may be used for these units, with the barrier layer types preferred over the vacuum emissive types. Of the former, silicon exhibits less change in characteristics with temperature than does germanium, but the present cost of a matched silicon quad (four rectifiers) is considerably greater than for a germanium quad.

Diode rectifiers 10 and 11 are cross-connected by wires 13 and 14, reaching extremity points "*x, y*" in the circuit to output transformer 15. This transformer is similar but opposite to the input transformer 2. It has balanced primary windings 16 and 17, core 18, electrostatic shield **18*a* and secondary 19**. Both input transformers and output transformers may be of the hybrid type, that is, multi-winding units with accurately balanced windings as used in carrier telephony. In any event, the transformers used should be balanced and symmetrical, each double coil winding having the same number of turns, being wound in the same direction and having the same inductive relation to the single coil, equal stray capacitance thereto, to the core, and so on. I find that commercially manufactured transformers are suitable, however, which is of practical advantage in the industrial application of my invention.

The general mode of operation of the ring modulator is known and need be no more than sketched here. An oscillator 8 supplies a continuous oscillation at a frequency selected to beat with the signal source 1 to produce the desired sum or difference frequency across the output transformer 15. It is desirable to make the carrier oscillator 8 output voltage amplitude large compared with the amplitude output of signal source 1 so that the effect is to switch diode units 9, 10, 11 and 12 on and off at the frequency of the carrier oscillator voltage. For instrumentation purposes an oscillator voltage of one or more volts has been found satisfactory. The amplitude of the voltage output of the oscillator should be stable. Sufficient stability is obtained with instrument type and normal commercial oscillators but stability is not a factor to be neglected. The desired oscillator voltage balance for elimination depends critically upon the rectifier resistance and capacitance balance and these are functions of the applied oscillator voltage in practical rectifier units of today.

The signal voltage source 1 supplies the waveform to modulate the carrier oscillator voltage in the modulator. Because of the degree of elimination of the residual oscillator voltage which I obtain the signal amplitude may be as small as of the order of microvolts and at a very low frequency and still a useful modulated signal obtained. Rectifier units 9, 10, 11 and 12 act as properly poled relays to switch the oscillator voltage on to the amplitude determined by the signal.

As is known, both the signal and the oscillator frequencies are theoretically absent in the output of a ring modulator. Only the sidebands are present; that is, the frequencies which are the sum of the oscillator and signal frequencies and the frequencies which are the difference of the oscillator and signal frequencies. The essence of my invention is to achieve this theoretical condition in practice.

It is to be noted in passing that the bridge type modulator does not eliminate the signal frequency but passes this on at an amplitude commensurate with the amplitude of the sidebands.

In any case, the frequency of oscillator 8 may be made adjustable, as for heterodyning various signal frequencies over a whole spectrum to a fixed frequency of relatively narrow frequency band depending upon the nature of the signal for subsequent intermediate frequency amplification beyond secondary 19.

In Fig. 1 my balancing system is exemplified by potentiometer 20, having adjustable arm 21, and differential capacitor 22, having equal and opposed stators 23 and 24 and rotor 25.

The second connection from oscillator 8 connects to the center tap portions of the potentiometer and the capacitor, i.e., arm 21 and rotor 25. A balance and therefore a minimum oscillator voltage across secondary 19 occurs when the midpoint connections at both 7 and 21 are accurately midpoints with respect to the whole structure, which includes transformers 2 and 15 and the four rectifiers 9, 10, 11 and 12. It is important that not only the amplitude of any residual oscillator voltage be equal in the double primary 16 and 17 but that the phase be the same so that complete opposition of the current flow through each of the windings occur and thus result in cancellation in secondary 19. It is for this reason that both a resistor and capacitor are included. The combination makes it possible to alter the phase angle and the center tap location. Variation of the position of the center tap of the system by adjusting arm 21 along the potentiometer is apparent. With the capacitor, the movement of rotor 25 upward from the position shown increases the capacitance between stator 23 and the rotor and at the same time decreases the capacitance between stator 24 and the rotor. The value of capacitance determines the inverse of the value of capacitive reactance, thus the latter is decreased from oscillator 8 to the upper half of the system and increased to the lower half, changing the phase angle.

In the circuit of Fig. 1 the value of the total resistance of potentiometer 20 may not be too large, say of the order of 10 ohms, in order that the resistance in the circuit of primaries 16 and 17 will not be excessive and result in a larger insertion loss for the transformer than might be desired. Consequently, the differential (or "split") stator capacitor 22 is required to be of reasonably high capacitance if the frequencies handled by the modulator are in the audio range. A multiple variable air capacitor may be used, or another type such as mica insulated as long as the capacitor has three terminals, the capacitance between the center terminal and the other two varying oppositely as the capacitor adjustment is made.

Another manner in which capacitor 22 may be of only a few hundred micromicrofarads size and still handle audio frequencies is to provide a padding capacitor 26, shown dotted in Fig. 1. Should any particular combination of four rectifier units and two transformers be fairly closely balanced, capacitor 26 would not be needed and the somewhat restricted range of the small capacitance variable capacitor 22 would suffice to accomplish balance. Should the system not be inherently closely balanced the additional fixed (or variable) capacitor 26 corrects the gross mis-balance and capacitor 25 accomplishes the accurate balance now within its range. Depending upon the direction of the gross mis-balance capacitor 26 is either connected to side *"x"* as shown, or to the opposite side *"y."*

For radio frequencies capacitor 26 would not be required and cores 4 and 18 would be of powdered iron or equivalent, or even absent. Transformers 2 and 15 would be air core in the latter case, as understood by those skilled in the art.

Oscillator 8 is normally of the usual vacuum tube type providing a sinusoidal waveform output voltage as has been discussed. It is immaterial to my invention, however, as to what form this oscillator takes and the waveform of the output for unusual functioning largely inherent to it.

Figure 2:
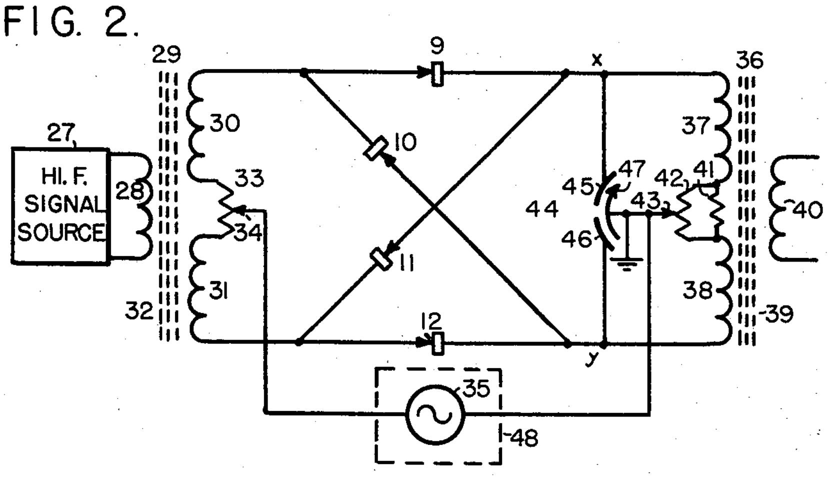
Fig. 2 shows the preferred circuit including all adjustments.

In Fig. 2 there is shown a modulator having two more elements than are shown in Fig. 1. These enhance the versatility and performance of my device. The remaining original elements may be the same as shown in Fig. 1, but I have shown elements suited for the low radio frequencies to more fully illustrate the invention. High frequency signal source 27 indicates a source of signal to be modulated which is of higher frequency than the signal source 1 of Fig. 1. Magnetic core 32 is of powdered iron or equivalent. Primary 28 connects to source 27 and secondaries 30 and 31 connect to the rectifier ring 9, 10, 11 and 12 as before. The germanium or equivalent crystal diodes previously mentioned are effective to high radio frequencies and these need not be altered insofar as frequency is concerned. In-put transformer secondaries 30 and 31 are joined at adjacent ends of these windings by a potentiometer 33 having adjustable arm 34 and a resistance of the order of 10 ohms in a typical case. High frequency oscillator 35 is connected to arm 34. Output transformer 36 is comprised of balanced primaries 37 and 38, powdered core 39 and secondary 40. The primaries are now joined by a relatively low valued resistor 41, of the order of 10 ohms, and this is shunted by potentiometer 42 having adjustable arm 43 and a relatively high resistance value of the order of a few thousand ohms. Capacitor 44 is of the same type previously mentioned and may be of somewhat smaller capacitance, of one hundred micromicrofarads or less. The second connection from oscillator 35 is connected to the junction between arm 43 and rotor 47 as before. This junction may be grounded as shown in Fig. 2 to allow the use of an oscillator with an unbalanced output, i. e., one terminal thereof grounded, or for other reasons of stability, balance or shielding.

The differences between the circuits of Figs. 1 and 2 are as follows: The connection of oscillator 35 to potentiometer arm 34 allows an accurate balance to be obtained with respect to oscillator voltage and transformer 29. This allows a relatively high degree of elimination of that voltage from the input circuit, i.e., source 27. This is desirable for a number of reasons, particularly if the level of the signal source be low. Intermodulation in vacuum tube or equivalent active elements in the source is prevented with a resulting increased purity of the final output. Also, regeneration and feedback conditions are minimized, as is oscillator radiation through this part of the circuit, of importance should it contain an antenna or loop. Oscillator 35 may be individually shielded, as by shield 48, and the modulator as a whole by a shield simply surrounding it, but antenna elements may not be so shielded.

Passing now to the bridge-balancing elements, it is seen that the oscillator is now fed into the bridge through the relatively high resistance (approximate) halves of potentiometer 42. In the split primary 37 and 38, however, the effective resistance is somewhat less than the value of resistor 41 alone, i.e., a relatively low value. Because the resistive component of the oscillator feed is now relatively high, the capacitative reactance component may also be correspondingly relatively high. This means a smaller value of capacitance, consequently a smaller capacitor. In this way, even for audio frequencies, I am able to accomplish balancing with small components. This is of importance in airborne equipment and for almost all applications of the present day because of the practice of miniaturization.

As has been previously mentioned, attenuation of the oscillator voltage in my modulators of as much as 120 db below the oscillator input has been attained in practical operation. The operating shafts of capacitor 44 and potentiometer 42, or the equivalents in the other figure, are conveniently made front panel controls on apparatus of instrument calibre and serviceman's controls on apparatus of lesser precision. The controls are continuous in degree of adjustment and balance the whole system at once. This is obviously superior to any arrangement which affects only one rectifier or one-half of the system, or which requires a multiplicity of controls to be manipulated. Accurate balance can be quickly achieved and measurements rapidly taken with my controls.

I have found that proper frequency response and stability of balance are enhanced in this modulator if the impedance of the signal source (1 or 27) does not vary substantially over any frequency band of interest. This can be accomplished if the modulator is fed from a resistive network of constant impedance or from a cathode follower connected vacuum tube. Similarly, the setting of the capacitor balance (22 or 44) does not require substantial readjustment if the source impedance of the oscillator (8 or 35) does not vary. Since a relatively low impedance is desirable in feeding modulators of this type this can be accomplished by means of a stepdown transformer or by means of a cathode follower vacuum tube.

Certain instruments to which my modulator is applicable include field-intensity receivers, wave analyzers and distortion analyzers. In these instruments a variable frequency oscillator is required, the frequency of which is relatively close to the intermediate frequency of amplification of the device. It is thus important that the residual oscillator voltage in the output of the modulator be at a very low level to prevent this voltage from contributing a spurious component to the measured output.

Alternate arrangements of my invention are possible. As to grounding, the junction of the capacitor and potentiometer arm in Fig. 2 need not be grounded as shown, or a ground may be connected at this point in Fig. 1 where this has not been shown. Also, it may be omitted from this junction and connected to the center tap of the input transformer, i.e., at 7 in Fig. 1 or 34 in Fig. 2.

Electrostatic shields 4*a* and 18*a* in Fig. 1 may be included in the transformer of Fig. 2, or these may be omitted in any embodiment without vitiating my balancing arrangement.

Signal source 1, transformers 2 and 15 and oscillator 8 of Fig. 1 may replace high frequency source 27, transformers 29 and 36 and oscillator 35 of Fig. 2. Also, other impedances may replace the transformers as long as a center-tap is available for the usual connection of the oscillator and for the balancing elements.

Although I do not prefer employing the usual thermionic electron emission diodes or multielectrode tubes my invention is fully suited for balancing a modulator utilizing such devices for rectifiers 9, 10, 11 and 12.

Specific values have been given to certain independent variables in this specification in order to most fully teach how the invention may be embodied. Wide variations may be taken from such values and changes made in details, ratios and proportions without departing from the spirit of my invention.

Having thus fully described my invention and the manner in which it is practiced, I claim:

1. A balanced ring modulator comprising an input transformer having a primary and a two-winding secondary, a source of signal voltage connected to said primary, two oppositely-poled electrically matched rectifiers connected to each extremity of said two-winding secondary, an output transformer having a two-winding primary and a secondary, one similarly-poled of each of said rectifiers connected to the extremities of said two-winding primary, the other oppositely poled of said rectifiers cross-connected to the extremities of said two-winding primary, a balanced threee terminal adjustable capacitor, opposite terminals of said capacitor connected to the extremities of said two-winding primary, only a single potentiometer having a variable arm and a shunting resistor thereacross connected symmetrically between the windings opposite the extremities of said two-winding primary, the variable arms of said potentiometer and the center terminal of said capacitor electrically connected together, an oscillator circuit of constant impedance output, low with respect to the impedance of the windings of said transformers, said oscillator circuit connected to said variable arm of said potentiometer and symmetrically to said two-winding secondary, and means to adjust said adjustable capacitor and to adjust said variable arm of said potentiometer to allow a low minimum voltage from said oscillator prior to appear at the secondary of said output transformer in relation to the amplitude of voltage from said source of signal.

2. In a ring modulator having non-linear elements of similar electrical characteristics a balancing circuit for reducing oscillator voltage in the output circuit of said modulator, said output circuit having a split-winding primary output transformer; comprising, a differential variable capacitor having two opposing and one common element, each opposing element directly connected to one extremity of said primary, only one potentiometer having two fixed terminals and an adjustable arm, the fixed terminals of said potentiometer symmetrically connected between the adjacent ends of said split-winding primary, an oscillator of constant and low impedance with respect to that of said split-winding primary to produce said oscillator voltage, said common element and said adjustable arm connected together and to said oscillator, and means to adjust said common element with respect to said opposing elements of said capacitor and to adjust said adjustable arm of said potentiometer to accomplish phase and amplitude balance of said oscillator voltage in said output transformer to reduce the amplitude of said oscillator voltage in said output transformer to a very small fraction of the full amplitude of said oscillator voltage.

3. A balanced ring modulator comprising an input transformer having a primary and a two-winding secondary, a source of signal voltage connected to said primary, two oppositely-poled semiconductor rectifiers of similar electrical characteristics connected to each extremity of said two-winding secondary, a first adjustable potentiometer connected between the two adjacent ends of the windings of said two-winding secondary, an output transformer having a two-winding primary and a secondary, one of each of said semiconductor rectifiers connected to the extremities of said two-winding primary, the other oppositely-poles of said semiconductor rectifiers cross-connected to the extremities of said two-winding primary, a resistor and only a second adjustable potentiometer connected in parallel and between the two adjacent ends of the windings of said two-winding primary, the resistance of said resistor being much less than the resistance of said second potentiometer, an adjustable capacitor having two stators and one rotor, said stators connected to the extremities of said two-winding primary, said rotor connected to the adjustable arm on said second potentiometer, hence also to the two adjacent ends of said two-winding primary, oscillator means of constant impedance low with respect to that of the transformer elements, said oscillator means connected to the adjustable arm of both said first and second potentiometers, means to adjust said second potentiometer and said capacitor to allow a minimum voltage from said oscillator means to pass to the secondary of said output transformer, and means to adjust said first potentiometer to allow a minimum voltage from said oscillator means to pass to said source of signal voltage.

4. In a ring modulator having rectifier elements of similar electrical characteristics and a constant impedance oscillator with cathode-follower output, a balancing circuit for reducing oscillator voltage in the output circuit of said modulator having a two-winding primary output transformer comprising a differential variable capacitor having two opposing stators and a common rotor, each stator connected to one extremity of said primary, a resistor connecting the adjacent terminals of said primary, only one adjustable potentiometer having a higher resistance than said resistor and connected directly in parallel thereto, said potentiometer having an adjustable arm connected to said rotor and to said oscillator producing said oscillator voltage, and means to adjust said rotor with respect to said stators of said capacitor and to adjust said adjustable arm of said potentiometer to accomplish phase and amplitude balance of said oscillator voltage in said output transformer secondary to reduce said oscillator voltage in said output transformer secondary of the order of 100 decibels below that of said oscillator.

5. In a ring modulator a balanced circuit arrangement for reducing oscillator voltage in both input and output circuits of said modulator having an input transformer with a two-winding secondary and an output transformer with a two-winding primary both of high impedance comprising an oscillator of low and constant impedance, a differential variable capacitor having two opposing capacitor elements and a common capacitor element, each of said opposing capacitor elements connected to one extremity of said primary, a resistor connecting the adjacent terminals of said primary, a first adjustable potentiometer having a considerably higher resistance than said resistor and connected directly in parallel therewith, said first potentiometer having an adjustable arm electrically connected to said common capacitor element and to one terminal of said oscillator producing said oscillator voltage, a second adjustable potentiometer connecting the adjacent terminals of the two-winding secondary of said input transformer, said second potentiometer having an adjustable arm connected to the other terminal of said oscillator, means to adjust the adjustable arm of said second potentiometer to reduce said oscillator voltage in said input circuit, means to adjust the adjustable arm of said first potentiometer to accomplish amplitude balance of said oscillator voltage in said output circuit, and means to adjust said common capacitor element with respect to said opposing capacitor elements to accomplish phase balance of said oscillator voltage in said output circuit to reduce the amplitude of said oscillator voltage to a negligibly small value at the output of said output transformer.

6. In a ring modulator having non-linear semiconductor elements of closely similar electrical characteristics a balancing circuit for reducing oscillator voltage in the output circuit of said modulator having a two-winding primary output transformer comprising a differential variable capacitor having two balanced stators and a common rotor, each stator connected to an extremity of the windings of said primary, only one potentiometer having two extremity connections and a variable tap connection, one of each of said extremity connections of said potentiometer connected to only one of each adjacent connections of said two-winding primary, said common rotor and said variable tap connection connected together and to the oscillator producing said oscillator voltage, a second capacitor connected to said common rotor and to an extremity of the windings of said primary to correct an unbalance thereat, a source of oscillator voltage of essentially constant impedance low with respect to the impedance of the other recited elements, and means to adjust the rotor with respect to the stators of said variable capacitor and to adjust the variable tap of said potentiometer to accomplish phase and amplitude balance of said oscillator voltage at said output transformer to effect a great reduction of said oscillator voltage across said output transformer.

References Cited in the file of this patent

UNITED STATES PATENTS

| | | |
|---|---|---|
| 2,682,640 | Harling | June 29, 1954 |

FOREIGN PATENTS

| | | |
|---|---|---|
| 152,142 | Australia | July 2, 1953 |
| 604,803 | Great Britain | July 9, 1948 |
| 709,944 | Germany | July 24, 1941 |